United States Patent [19]

Hsieh et al.

[11] Patent Number: 5,282,271
[45] Date of Patent: Jan. 25, 1994

[54] I/O BUFFERING SYSTEM TO A PROGRAMMABLE SWITCHING APPARATUS

[75] Inventors: Wen-Jai Hsieh, Vancouver, Wash.; Yih-Chyun Jeng, Lake Oswego, Oreg.; Chi-Song Horng, Palo Alto, Calif.; Keith Lofstrom, Hillsboro, Oreg.

[73] Assignee: I-CUBE Design Systems, Inc., Santa Clara, Calif.

[21] Appl. No.: 912,975

[22] Filed: Jul. 6, 1992

Related U.S. Application Data

[62] Division of Ser. No. 784,901, Oct. 30, 1991.

[51] Int. Cl.$^5$ .............................................. G06F 13/00
[52] U.S. Cl. .................................... 395/275; 395/250
[58] Field of Search .................. 295/250, 275; 307/465

[56] References Cited

U.S. PATENT DOCUMENTS

| | | | |
|---|---|---|---|
| 4,462,084 | 7/1984 | Greenwood | 395/250 |
| 4,910,704 | 3/1990 | Gemma | 395/250 |
| 5,015,884 | 5/1991 | Agrawal et al. | 307/465 |
| 5,113,368 | 5/1992 | Le Calvez et al. | 395/250 |

Primary Examiner—Arthur G. Evans
Assistant Examiner—Sang Hu Mike Kim
Attorney, Agent, or Firm—Smith-Hill and Bedell

[57] ABSTRACT

A field programmable interconnect device (FPID) flexibly interconnects a set of electronic components such as integrated circuits and other devices to one another. The FPID is an integrated circuit chip including a set of ports and a cross-point switch that can be programmed to logically connect any one port to any other port. Each FPID buffer port may be programmed to operate in various modes including unidirectional and bi-directional, with or without tristate control, and to operate at various input or output logic levels with adjustable pull up currents. Each FPID buffer port may also be programmed to perform various operations on buffered signals including adjustably delaying the signal, inverting it or forcing it high or low. The FPID is linked to a host computer via a bus that permits the host computer to program the FPID to make the desired connections, to select various modes of operation of buffers within the FPID and to read out data stored in the FPID. Each port of an FPID also samples and stores data indicating states of the signal passing through it over the last several system clock cycles. The FPID can subsequently read out the stored data to the host computer.

6 Claims, 5 Drawing Sheets

I/O BUFFERING SYSTEM TO A PROGRAMMABLE SWITCHING APPARATUS

This is a division of application Ser. No. 07/784,901 filed Oct. 30, 1991.

CROSS REFERENCE TO RELATED APPLICATIONS

The field programmable interconnect device as described herein is also described in co-pending U.S. patent application Ser. No. 07/785,082 entitled "Field Programmable Circuit Board" filed concurrently herewith. A bi-directional bus repeater as described herein is also described and claimed in co-pending U.S. patent application Ser. No. 07/785,299 entitled "Bi-directional Bus Repeater" filed concurrently herewith.

BACKGROUND OF THE INVENTION

1. Field of the Invention

The present invention relates in general to electronic systems and in particular to a system for flexibly interfacing the various components of an electronic system.

2. Description of the Art

Many electronic systems employ field programmable gate arrays (FPGAs), such as those manufactured by Xilinx Inc., to reconfigure selectively system component interconnections for various modes of system operation. A typical FPGA includes several input and output ports and a network of logic gates interconnecting the input and output ports wherein the logic gates respond to signals at the input ports by generating signals at the output ports. The FPGA also includes a number of memory cells that store data transmitted thereto from an external source such as a computer. The memory cells control switching states of various gates in the FPGA. by appropriately loading data into the memory cells, the computer can configure the FPGA in order to generate an output signal at any given port that is a selected logical combination of states of input signals at one or more of the input ports. Thus the FPGA may be used for selectively routing signals between system components and may also be used to perform various logic operations on the signals.

While programmable FPGAs are very useful, they have some limitations. All input/output signals must be unidirectional, and all signals must be of the same logic level. Thus the FPGAs cannot be connected to bi-directional buses and cannot interface differing types of devices such as CMOS and TTL devices.

SUMMARY OF THE INVENTION

In accordance with one aspect of the present invention, a field programmable interconnect device (FPID) flexibly interconnects a set of electronic components such as integrated circuits and other devices to one another. The FPID comprises an integrated circuit chip including a set of ports and a cross-point switch programmable to logically connect any one port to any other port.

In accordance with another aspect of the invention, each FPID buffer port may be programmed to operate in various modes including unidirectional and bi-directional, with or without tristate control, and to operate at either TTL or CMOS input or output logic levels with adjustable pull up currents.

In accordance with still another aspect of the invention, each FPID buffer port may also be programmed to perform various operations on buffered signals including adjustable delay of the signal, inverting the signal or forcing the signal high or low.

In accordance with yet another aspect of the invention, the FPID is linked to a host computer via a bus that permits the host computer to program the FPID to make the desired connections. The bus also enables the host computer to select various modes of operation of buffers within the FPID and to read out data stored in the FPID.

In accordance with a further aspect of the invention, each port of an FPID samples and stores data indicating states of the signal passing through it over the last several system clock cycles. The FPID can subsequently read out the stored data to a host computer, thereby enabling the host computer to show a user successive logic states of signals transmitted between components interconnected by the FPID.

It is accordingly an object of the invention to provide an improved system for flexibly interconnecting components of an electronic system.

It is another object of the invention to provide an improved system for flexibly buffering signals transmitted between electronic devices.

It is a further object of the invention, to provide a "smart" buffer that samples, stores and reads out data indicating successive logic states of the signal that it buffers.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

The present invention relates to a field programmable interconnect device (FPID) for flexibly interconnecting a set of electronic components such as integrated circuits and other devices to one another. An FPID is an integrated circuit chip including a multiple port cross-point switch that can be programmed to logically connect any one port to any other port, the FPID being linked to a host computer via an IEEE standard 1149.1 "JTAG" bus. As described in detail hereinbelow, the JTAG bus carries data between the FPID and the host computer and permits the host computer to program the FPID for making the desired connections. The JTAG bus also enables the host computer to select various modes of operation of buffers within the FPID and to read out data stored in the FPID.

Figure 1:
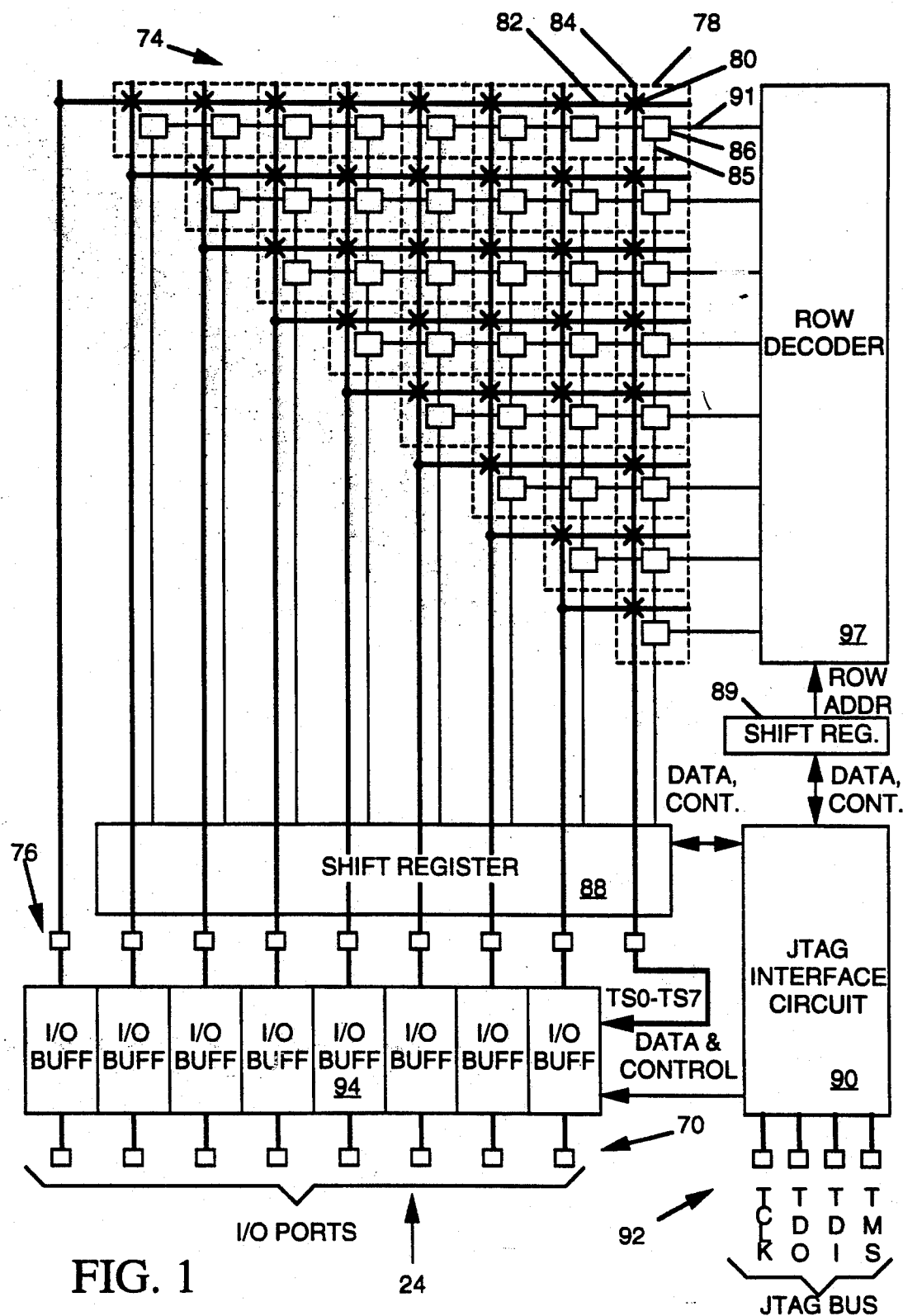
FIGS. 1 and 2 illustrate in block diagram form a field programmable interconnect device in accordance with the present invention.

FIG. 1 illustrates an FPID 24 in simplified block diagram form. According to the preferred embodiment of the invention, the FPID comprises a 208-pin integrated circuit and of these 208 pins, 160 pins provide input/output ports 70 for signals to or from external devices to be interconnected. In FIG. 1, only eight ports of the total 160 are shown. FPID 24 also includes a 176 port cross-point switch 74 which can selectively connect any one of its 176 ports 76 to any one or more of its other ports. In FIG. 1, only nine switch array ports 76 of the total 176 are shown. Switch 74 comprises a triangular array of 176 rows and columns of cross-point switch cells 78 with only eight rows and nine columns being shown in FIG. 1.

Each switch cell 78 consists of a switch 80 and a memory cell 86 wherein switch 80 selectively interconnects one horizontal signal line 82 with one vertical signal line 84. Memory cell 86 stores a single data bit, and the state of the stored data bit controls the state of switch 80. When the stored bit is high, the switch connects the horizontal and vertical signal lines 82 and 84 passing through the cell, but when the stored bit is low, the vertical and horizontal signal lines are disconnected. Each horizontal signal line 82 passes through all cells 78 of a separate array row, and each vertical signal line 84 passes through all cells 78 of a separate array column. Each one of the horizontal signal lines 82 and each one of the vertical signal lines 84 is hardwired to a corresponding one of the 176 array ports 76 of the cross-point switch 74.

By placing the appropriate data bits in the memory cells 86 of switch cells 78, any array port 76 may be connected to any other port or set of array ports 76. A separate data bit is concurrently supplied as input to the memory cells of each cell column through data outputs 85 of a 175-bit shift register 88. The JTAG interface circuit 90, responding to instructions from the host computer via the JTAG bus 92, shifts 175 data bits from the JTAG bus into shift register 88 and JTAG interface circuit 90 also stores a row address received via the JTAG bus in a shift register 89. A row decoder 87 decodes the row address stored in shift register 89 to input enable the memory cells 86 of one row of switch cells 78 via one of memory control lines 91 supplied in parallel to each memory cell of a row so that each memory cell of the row stores a separate one of the 175 data bits from shift register 88. To program the entire switch, the process of storing data in shift register 88 and input enabling a row of memory cells is repeated for each of the 176 cell rows of the cross-point array. A set of 160 input/output buffers 94 interconnect the 160 FPID I/O ports 70 with 160 of the 176 array ports 76 of cross-point switch 74. Eight of the 176 array points 76 provide tristate control inputs TS0-TS7 to I/O buffers 94.

Figure 2:
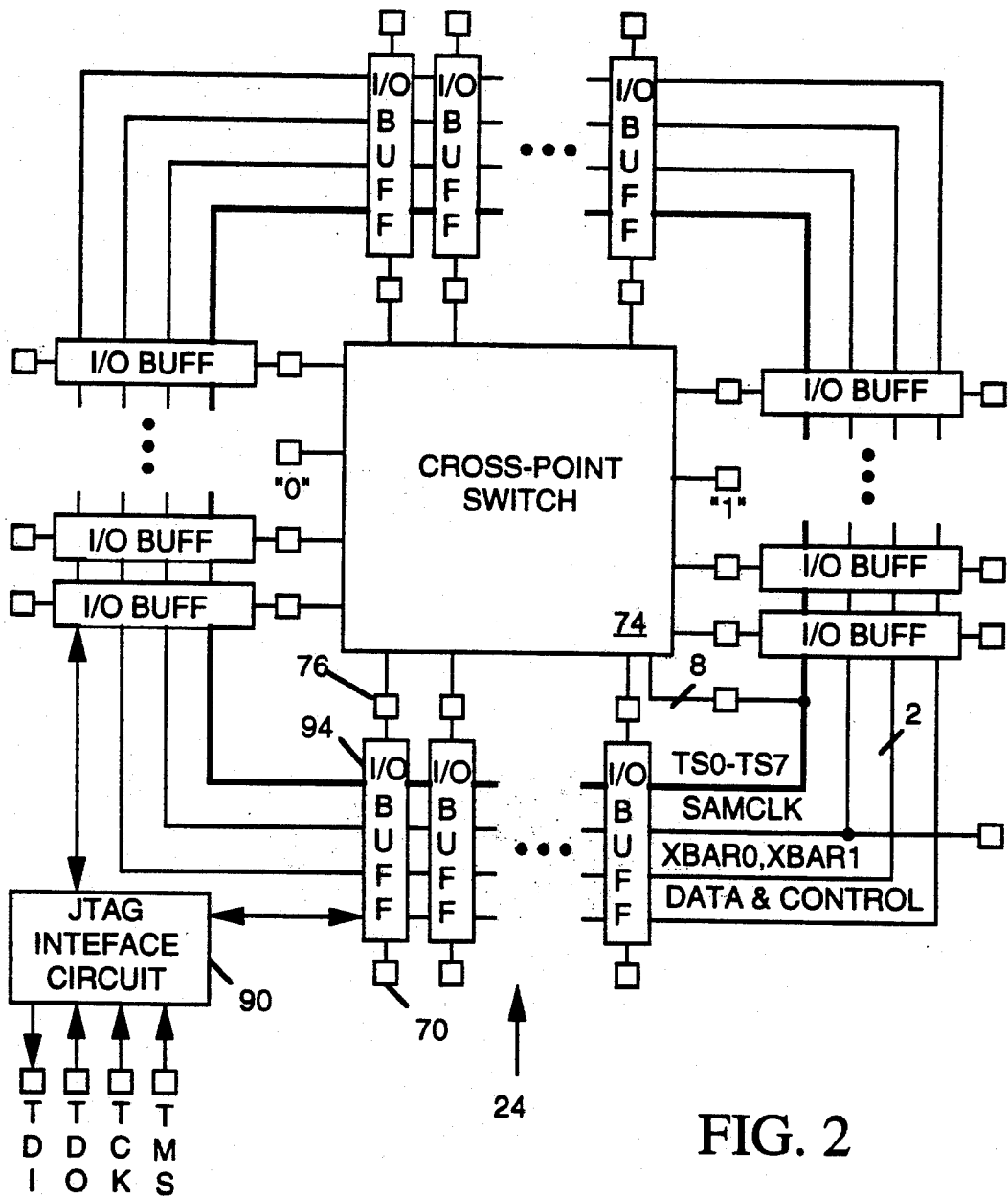

FIG. 2 also illustrates an FPID 24 in block diagram form. Shift register 88 and row decoder 97 from FIG. 1 are omitted in FIG. 2. In FIG. 2 I/O buffers 94 are shown surrounding cross-point switch 74 and connecting FPID I/O ports 70 to ports 76 of cross-point switch 74. High ("1") and low ("0") logic levels drive an additional pair of cross-point switch array ports 76. Eight ports 76 of switch 74 drive tristate control lines TS0-TS7 connected in parallel to each of I/O buffers 94. A clock signal SAMCLK applied to another I/O port 70 is connected in parallel to each I/O buffer 94 to control data sampling in a manner described hereinbelow. A pair of "outer cross-bar" lines XBAR0 and XBAR1 are also connected in parallel to all I/O buffers 94 and switches in each buffer 94 can be programmed to connect pin side port 76 to either the XBAR0 or XBAR1 wherein the XBAR1 and XBAR0 lines facilitate testing of the FPID. The JTAG bus signal lines TDI, TDO, TCK and TMS are tied to four pins 72 connected to JTAG interface circuit 90. Control and data outputs of interface circuit 90 are connected in parallel and serial fashion to all of the I/O buffers 94.

Figure 3:
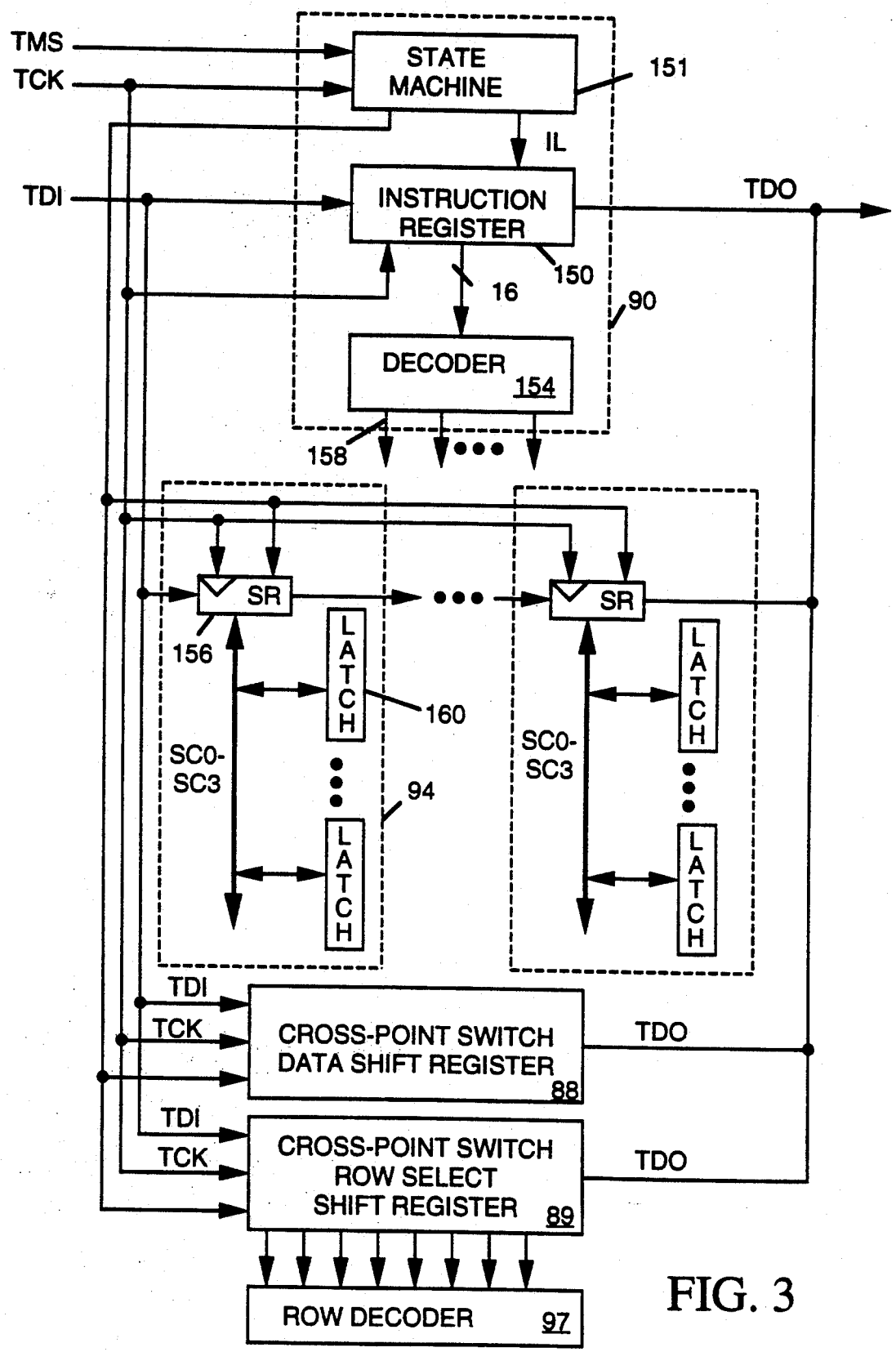
FIG. 3 is a block diagram of a JTAG interface circuit in block diagram form.

FIG. 3 illustrates the JTAG interface circuit 90 of FIGS. 1 and 2. The IEEE standard JTAG bus is intended for use in transmitting and sending serial data to and from digital circuit boards and is synchronously controlled by the host computer through a commercially available interface. Through the JTAG interface circuit 90, the host computer can program the FPID to provide the desired interface between external devices connected to pins 72.

Each FPID 24 port selectively provides any of several types of buffering, and the host computer uses the JTAG interface circuit 90 to select the type of buffering provided by each port. Each FPID can introduce an adjustable amount of port-to-port delay in signals passing through the device. The host computer also uses the JTAG interface to select the desired delay and each FPID 24 stores a record of the last 16 data bits appearing at each of its 160 ports. This type of data helps a user to understand the operation of the prototype electronic system. The JTAG interface circuit permits the host computer to access and display that data, the four JTAG lines being Test Data In (TDI), Test Data Out (TDO), Test Clock (TCK) and Test Mode Select (TMS). The TDI line carries data from the host computer and the TDO line carries data to the host computer. The TMS signal is supplied as input to a state machine 151 and indicates whether the JTAG bus is in the instruction loading or data shifting phase of operation. TCK is a clock signal employed to synchronize data transmission on the TDI and TDO lines.

State machine 151, clocked by the TCK signal, operates, as indicated, by the IEEE JTAG bus standard 1149.1 to produce two signals IL and DS. The state machine asserts the IL signal during the instruction loading phase and asserts the DA signal during the data shifting phase of JTAG bus operation. During the instruction loading phase, the host computer shifts a 16-bit instruction via the TDI line into a serial instruction register 150 in the JTAG interface circuit 90 that is input enabled by the IL signal from state machine 151. The TCK signal clocks each bit of the instruction data into register 150. This instruction is decoded by a decoder 154 which supplies read or write control signals 158 to latches, buffers and other devices within the FPID 24. The data stored in these devices controls FPID operation.

The control signals produced by decoder 154 select devices 160 in FPID I/O buffers 94 to read or write access a 4-bit bus SC0-SC3 connected to a parallel input of a 4-bit shift register 156, also included in each FPID I/O buffer 94. The 4-bit shift registers 156 of all FPID buffers are connected in series. During a data shifting phase of bus operation, when the shift registers 156 are enabled by the DS output signal of state machine 151 and are selected by output signals 158 of decoder 154, the host computer can serially shift data into all shift registers 156 via the TDI line and can read data shifted out of these registers via the TDO line. The data stored in the latches and other devices 160 connected to the SC0-SC3 bus controls FPID operation.

The read/write control signal outputs of instruction decoder 154 may also select cross-point switch data shift register 88 or row select shift register 89 to receive data from the JTAG bus when input enabled by the DS signal during a data shift phase of the bus. Shift register 88 (also seen in FIG. 1) supplies the switch control data to the cross-point switch. The row select shift register 89 supplies the row address to row decoder 97, also shown in FIG. 1.

Figure 4:
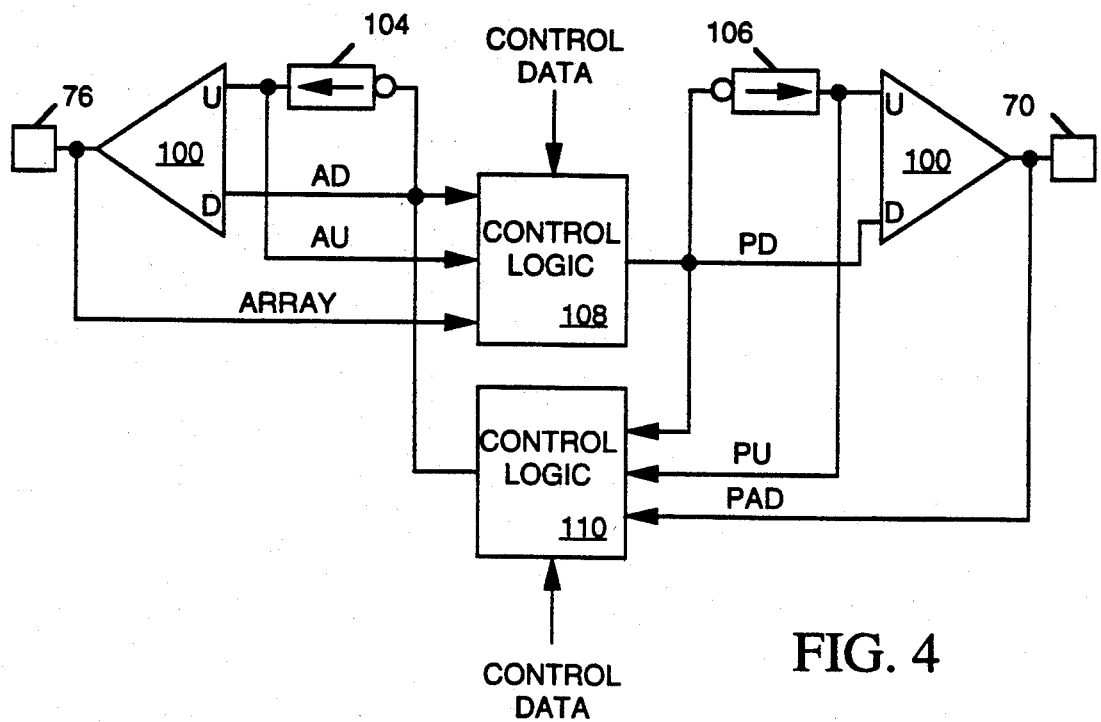
FIGS. 4 and 5 diagrammatically illustrate an I/O buffer of FIGS. 1 and 2.

FIG. 4 illustrates an I/O buffer 94 of FIG. 2 in simplified block diagram form. I/O buffer 94 includes an output buffer 100 for generating an output signal ARRAY for driving the array port 76 and an output buffer 102 for generating an output signal PAD for driving the I/O port 70. The output AU of a single-shot device 104 controls a pull up input U of buffer 100 while the output PU of another single-shot device 106 controls the pull up input U of buffer 102. The output PD of a control logic circuit 108 drives the single-shot device 106 and the pull down input D of buffer 102. Similarly, the output AD of another control logic circuit 110 drives the single-shot device 104 and the pull down input D of buffer 100. The output of single-shot device 106 is forced high when a UF output of control logic circuit 108 is high. Inputs to control logic circuit 108 include AU, AD and the signal ARRAY on array port 76 from the cross-point switch array. Inputs to control logic circuit 110 include PU, PD and the signal PAD at I/O port 70, an external pin of the FPID.

In response to control data supplied to control logic circuits 108 and 110, the I/O buffer 94 can operate in one of 11 different modes as follows:

Unidirectional input (UI)

In this mode the circuit passes data signals in one direction from I/O port 70 to cross-point array port 76. Logic circuit 108 and single-shot device 106 hold PD and PU low so that buffer 102 does not pull up or down on PAD. Logic circuit 110 drives AD low when PAD is high so that an AU pulse asserted by single-shot device 104 causes buffer 100 to pull up ARRAY. Trickle charges in buffer 100 hold ARRAY up after the PU pulse goes away. LOGIC circuit 110 drives AD high when PAD is low so that buffer 100 pulls down ARRAY.

Unidirectional inverted input (UII)

In this mode the circuit inverts signals at I/O port 70 and passes them to cross-point array port 76. Logic circuit 108 and single-shot device 106 hold PD and PU low so that buffer 102 does not pull up or down on PAD. Logic circuit 110 drives AD low when PAD is low so that an AU pulse asserted by single-shot device 104 causes buffer 100 to pull up ARRAY. Trickle charges in buffer 100 hold ARRAY up after the PU pulse goes away. LOGIC circuit 110 drives AD high when PAD is high so that buffer 100 pulls down ARRAY.

Unidirectional output (UO)

In this mode the circuit passes data signals in one direction from cross-point array port 76 to I/O port 70. Logic circuit 110 and single-shot device 104 hold AU and AD low so that buffer 100 does not pull up or down on ARRAY. Logic circuit 108 drives PD low when ARRAY goes high. Single shot device responds by pulsing PD causing buffer 102 to pull up PAD, and trickle charges in buffer 102 hold PAD up thereafter. Logic circuit 108 drives PU low when ARRAY is low so that buffer 100 pulls down PAD.

Bi-directional buffer (BDR)

In this mode the circuit passes data signals in either direction between I/O port 70 and cross-point array port 76 depending on which signal ARRAY or PAD is externally driven. In this mode control logic circuits 108 and 110 act like three-input NOR gates. In the quiescent state, when neither port is externally driven, trickle charges in buffers 100 and 102 hold both PAD and ARRAY high. Control logic circuits 108 and 110 hold PD and AD low and single-shot devices 104 and 106 hold PU and AU low. When an external device pulls ARRAY low, control logic circuit 108 turns on PD thereby causing buffer 102 to pull down PAD. When the external device releases ARRAY, trickle charges in buffer 100 pull up on array and control logic circuit 108 responds by pulling PD down. The falling edge of PD causes single-shot device 106 to pulse PU high, thereby causing buffer 102 to quickly pull up PAD. Thereafter trickle charges in buffer 102 continue to hold PAD up. When an external device pulls PAD low, control logic circuit 110 pulls up AD, thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter trickle charges in buffer 100 continue to hold ARRAY up.

Tristate unidirectional input (TUI)

In this mode the circuit passes data signals in one direction from I/O port 70 to cross-point array port 76 when a tristate input signal TS to control logic circuit 110 is held high. Logic circuit 108 and single-shot device 106 always hold PD and PU low so that buffer 102 does not pull up or down on PAD. Logic circuit 110 and single-shot device 104 normally hold AD and AU low when TS is low. When TS and PAD are driven high, logic circuit 110 drives AD low. Single-shot device 104 responds by pulsing AU so that buffer 100 pulls up ARRAY. Trickle charges in buffer 100 hold ARRAY up thereafter. When TS is high and PAD is driven low, logic circuit 110 drives AU low so that buffer 100 pulls down ARRAY.

Tristate unidirectional inverted input (TUII)

In this mode the circuit inverts data signals at I/O port 70 and passes them to cross-point array port 76, provided tristate input signal TS to control logic circuit 110 is held high. Logic circuit 108 always holds PU and PD low so that buffer 102 does not pull up or down on PAD. Logic circuit 110 normally holds AD and AU low when TS is low. When TS and PAD are driven high, logic circuit 110 drives AU low and AD high so that buffer 100 pulls down ARRAY. When TS is high and PAD is low, logic circuit 110 drives AU high and AD low so that buffer 100 pulls up ARRAY.

Tristate unidirectional output (TUO)

In this mode the circuit passes data signals in one direction from cross-point array port 76 to I/O port 70 when the tristate input signal TS to control logic circuit 108 is held low. Logic circuit 110 and single-shot device 104 always hold AD and AU low so that buffer 100 does not pull up or down on ARRAY. In the quiescent state, when TS is high, logic circuit 108 and single-shot device 106 hold PU and PD low so that buffer 102 does not control PAD. When TS is driven low and ARRAY is driven high, logic circuit 108 drives PD low. Single-shot device 106 pulses PU so that buffer 102 pulls up PAD. Trickle charges in buffer 102 hold up PAD thereafter. When TS is low and ARRAY is low, logic circuit 108 drives PD high so that buffer 102 pulls down PAD.

Tristate bi-directional buffer (TBDR)

In this mode the circuit passes data signals in either direction between I/O port 70 and cross-point array port 76 depending on which signal, ARRAY or PAD, is externally driven, provided the tristate input signal TS is high for input and low for output. In the quiescent state, when neither port is externally driven, trickle charges in buffers 100 and 102 hold PAD and ARRAY up. Control logic circuits 108 and 110 hold PD and AD low. Single-shot devices 104 and 106 hold PU and AU low. When an external device pulls ARRAY low in the presence of a low tristate control signal TS, control logic circuit 108 turns on PD, thereby causing buffer 102 to pull down PAD. When the external device releases ARRAY, trickle charges in buffer 100 pull ARRAY back up. Control logic circuit 108 responds by pulling PD down. The falling edge of PD causes single-shot device 106 to pulse PU high, thereby causing buffer 102 to quickly pull up PAD. Thereafter trickle charges in buffer 102 continue to hold PAD up. When an external device pulls PAD low while TS is high, control logic circuit 110 pulls up AD, thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter trickle charges in buffer 100 continue to hold ARRAY up.

Force logic "1" output (FL1O)

In this mode control logic circuit 108 holds PD low and holds UF high. The high UF signal drives up the PU output of single-shot device 106 which causes buffer 102 to pull up PAD.

Force logic "0" output (FL0O)

In this mode control logic circuit 108 holds PD high, thereby causing buffer 102 to pull down PAD regardless of the state of ARKAY.

No connect (NC)

In this mode control logic circuit 108 drives PD low and control logic circuit 110 drives AD low so that the outputs of buffers 100 and 102 float.

In any mode where signals pass from array port 76 to I/O port 70, the I/O buffer 94 of FIG. 4 will delay signal transfer by 0, 20, 40 or 60 nanoseconds as determined by control data supplied control logic circuit 108. Logic circuit 108 delays change in state of its PD output signal accordingly.

Figure 5:
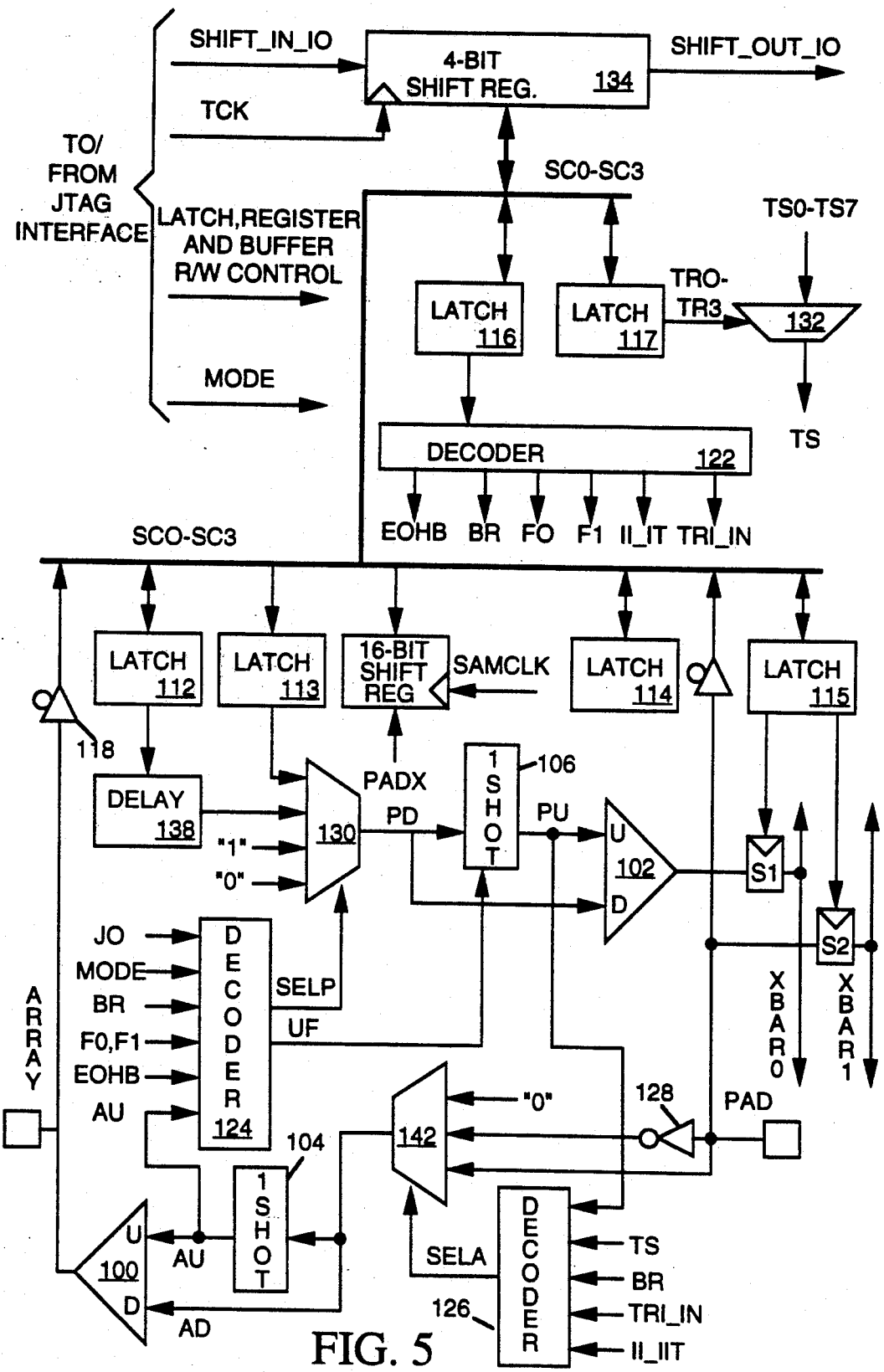

FIG. 5 depicts an I/O buffer 94 of FIG. 2 in more detailed block diagram form to illustrate the contents of control logic blocks 108 and 110 and to illustrate additional features of the buffer not apparent in FIG. 4. The I/O buffer includes a 4-bit shift register 134 that shifts in a data signal SHIFT_IN_IO and shifts out a data signal SHIFT_OUT_IO. Shift registers of all I/O buffers are connected in series with the SHIFT_OUT_IO signal of one I/O buffer providing the SHIFT_IN_IO signal to the next of the series. The JTAG interface circuit 90 of FIGS. 2 and 3 supplies the JTAG signal TDI as the SHIFT_IN_IO to the first buffer of the series, and connects the SHIFT_OUT_IO signal of the last buffer of the series to JTAG TDO line. The TCK JTAG signal clocks shift register 134 and a control signal from the JTAG controller input enables register 134.

The host computer may load control data into the shift registers 134 of all I/O buffers via the JTAG bus. One or more of the four data bits SC0-SC3 stored in shift register 134 are supplied as inputs to a set of latches 112-117, any one of which may be write enabled by the host computer via the JTAG interface. The following control data is supplied to latches in the I/O buffer via shift register 134:

D0,D1

These bits are stored in latch 112 and control the amount of signal delay passing through the buffer.

J0,J1

These bits are stored in latch 113 and are used to control the state of output buffer 102 when a MODE signal from the JTAG controller is asserted.

TC,PU0,PU1

These bits are stored in latch 114. The TC bit controls the maximum positive output swing (3 or 5 volts) of buffer 102 for compatibility with CMOS or TTL devices. The PU0 and PU1 bits switch output current sources (3, 17 or 20 mA) in buffer 102.

OX0,OX1

These bits are stored in latch 115 and control a pair of switches S1 and S2 for selectively connecting the PAD output of buffer 102 to the XBAR0 and XBAR1 outer crossbar transfer gates.

FN0-FN3

These bits are stored in latch 116 and select the operating mode of the buffer: unidirectional input, unidirectional inverted input, unidirectional output, bi-directional buffer, tristate unidirectional input, tristate unidirectional inverted input, tristate unidirectional output, tristate bi-directional buffer, force logic "1" output, force logic "0" output or no connect.

TR0-TR3

These bits stored in latch 117 control a multiplexer 132 that selects the particular one of eight lines TS0-TS7 to be employed as tristate control signal TS for the buffer.

Control logic circuit 108 of FIG. 4 is implemented by the combination of decoders 122 and 124, a multiplexer 130 and a variable delay circuit 138. The ARRAY signal delayed by a variable amount of time and supplied as an ARRAY input to multiplexer 130. Delay circuit 138 delays the ARRAY signal by 0, 10, 20 or 30 nanoseconds, depending of the state of the D0, D1 bits stored in latch 112. A logic "0", a logic "1" and the J1 bit stored in latch 113 are also supplied as inputs to multiplexer 130. The output of multiplexer 130 is PD signal supplied as input to single-shot device 106 and to the pull down input of buffer 102. As discussed below, decoder 124 decodes several input signals from decoder 122 and elsewhere to produce an output signal SELP that controls the switching state of multiplexer 130. Decoder 124 also produces the UF signal that can force up the PD output of single-shot device 106.

Control logic circuit 110 of FIG. 4 is implemented by the combination of decoders 122 and 126, an inverter 128 and a multiplexer 142. The PAD signal is inverted by inverter 128 to produce a PADX signal. PADX and PAD are supplied as inputs to multiplexer 142. A "0" logic level is tied to another input of multiplexer 142. Multiplexer 142 selects one of its inputs as the AD output applied to the pull down D input of buffer 100 and to the input of single-shot device 104. As discussed below, decoder 126 decodes several input signals to produce a signal SELA that controls multiplexer 142.

Decoder 122 decodes the mode control bits FN0–FN3 from latch 116 and a MODE signal from the JTAG controller to produce the following signals used locally within the buffer:

EOHB

This signal, when not active, tells decoder 124 to select the 0 logic level input to multiplexer 130. This causes PD and PU to remain low so that buffer 102 can neither pull up nor pull down PAD. When EOHB is active, decoder 124 can select an input to multiplexer 130 that may drive PD up. Decoder 122 asserts EOHB when the FN0–FN3 bits indicate the I/O buffer is in the unidirectional output mode, in the bi-directional buffer mode or in the tristate bi-directional buffer mode.

BR

This signal tells decoders 124 and 126 when the I/O buffer is to operate in one of the bi-directional buffer modes. When BR is asserted, decoder 124 switches multiplexer 130 to select the output of delay circuit 138 (unless inhibited by AU) and decoder 126 switches multiplexer 142 to select its PAD input (unless inhibited by PU).

TRI_IN

This signal tells decoder 126 that the I/O buffer is in one of the tristate modes. When TRI_IN is asserted, decoder 126 tells multiplexer 142 to select its "0" input unless the tristate control signal TS is asserted. When TS is asserted, decoder 126 tells multiplexer 142 to select the PAD input.

II_IIT

This signal is asserted when the I/O buffer is in one of the inverting modes and causes decoder 126 to switch multiplexer 142 to select its PADX input.

F0

This signal is asserted when the I/O buffer is in the force "0" logic output mode. It tells decoder 124 to select the logic "1" input to multiplexer 130, thereby driving up the PD input to buffer 102 and pulling down its output PAD.

F1

This signal is asserted when the I/O buffer is the force "1" logic output mode. It tells decoder 124 to assert its UF output to force up the output PU of one shot device 106. This causes buffer 102 to drive PAD high.

The following is a truth table for decoder 124. An "X" indicates the signal is asserted, an "O" indicates the signal is not asserted and a "-" means signal state is not relevant.

TABLE I

| MODE OF OPERA- TION | INPUTS | | | | | OUTPUTS | |
|---|---|---|---|---|---|---|---|
| | F0 | F1 | BR | MODE | EOHB | SELP | UF |
| UI | O | O | O | O | O | "0" | O |
| UII | O | O | O | O | O | "0" | O |
| UO | O | O | O | O | X | ARRAYB | O |
| BDR | O | O | X | O | X | ARRAYB* | O |
| TUI | O | O | O | O | O | "0" | O |
| TII | O | O | O | O | O | "0" | O |
| TUO | O | O | O | O | X | ARRAYB | O |
| TBDR | O | O | X | O | X | ARRAYB* | O |
| FL1O | O | X | — | O | — | "0" | X |
| FL0O | X | O | — | O | — | "1" | O |
| NC | O | O | X | O | O | "0" | O |
| ANY MODE | — | — | — | X | — | J1 | J0 |

*AU when asserted requires SELP selection of "0" in the bi-directional buffer modes.

The following is a truth table for decoder 126. An "X" indicates the signal is asserted, an "O" indicates the signal is not asserted and a "-" means signal state is not relevant.

TABLE II

| MODE OF OPERA- TION | INPUTS | | | | OUTPUT |
|---|---|---|---|---|---|
| | TS | BR | TRI_IN | II_II | SELB |
| UI | — | O | — | O | PADX |
| UII | — | O | O | X | INVERSE PADX |
| UO | O | X | X | — | "0" |
| BDR | — | X | O | — | PADX* |
| TUI | X | O | X | O | PADX |
| TII | X | O | X | X | INVERSE PADX |
| TUO | O | X | X | — | "0" |
| TBDR | X | X | X | — | PADX* |
| FL1O | O | X | X | — | "0" |
| FL0O | X | X | X | — | "0" |
| NC | O | X | X | — | "0" |

*PD when asserted requires "0" as SELB output in the bi-directional buffer modes.

The following is a truth table for decoder 122. An "X" indicates the signal is asserted, an "O" indicates the signal is not asserted.

TABLE III

| INPUT | OUTPUTS | | | | | |
|---|---|---|---|---|---|---|
| FN0–FN3 | EOHB | BR | F0 | F1 | II_IIT | TRI_IN |
| UI | O | O | O | O | O | O |
| UII | O | O | O | O | X | O |
| UO | X | O | O | O | O | O |
| BDR | X | X | O | O | O | O |
| TUI | O | O | O | O | O | X |
| TII | O | O | O | O | X | X |
| TUO | X | O | O | O | O | O |
| TBDR | X | X | O | O | O | O |
| FL1O | O | O | O | X | O | O |
| FL0O | O | O | X | O | O | O |
| NC | O | X | O | O | O | O |

There has thus been described a field programmable interconnect device for selectively interfacing electronic components with various types of buffering, logic levels and delay times. Each FPID is further described as being capable of sampling and storing data indicating states of its ports over its several system clock cycles for subsequent read out by a host computer.

While the foregoing specification has described a preferred embodiment of the present invention, one skilled in the art may make many modifications to the preferred embodiment without departing from the invention in its broader aspects. The appended claims therefore cover all such modifications as fall within the true spirit of the invention.

We claim:

1. A bi-directional buffer for providing interface between a first port signal and a second port signal comprising:

first driver means receiving first and second input signals for driving said first port signal to a first logic state in response to assertion of said first input signal and for driving said first port signal to a second logic state in response to assertion of said second input signal;

second driver means receiving third and fourth input signals for driving said second port signal to a third logic state in response to assertion of said third input signal and for driving said second port signal to a fourth logic state in response to assertion of said fourth input signal;

first single-shot means receiving said first input signal for asserting and the deasserting said second input signal in response to said first input signal;

second single-shot means receiving said third input signal for asserting and then deasserting said fourth input signal in response to said third input signal;

first logic means receiving said second port signal, said third input signal and said fourth input signal for controlling assertion of said first input signal in response to logical combinations of states of said second port signal, said third input signal and said fourth input signal; and second logic means receiving said first port signal, said first input signal and said second input signal, for controlling assertion of said third input signal in response to logical combinations of states of said first port signal, said first input signal and said second input signal.

2. A bi-directional buffer for providing interface between first and second port signals, a mode of operation of said interface being selected by first and second control signal, the buffer comprising:

first driver means receiving first and second input signals for driving said first port signal to a first logic state in response to assertion of said first input signal and for driving said first port signal to a second logic state in response to assertion of said second input signal;

second driver means receiving third and fourth input signals for driving said second port signal to a third logic state in response to assertion of said third input signal and for driving said second port signal to a fourth logic state in response to assertion of said fourth input signal;

first single-shot means receiving said first input signal for asserting and then deasserting said second input signal in response to said first input signal;

second single-shot means receiving said third input signal for asserting and then deasserting said fourth input signal in response to said third input signal;

first logic means receiving said second port signal, said third input signal, said fourth input signal and said first control signal, for controlling assertion of said first input signal in response to logical combinations of states of said second port signal, said third input signal and said fourth input signal; and second logic means receiving said first port signal, said first input signal, said second input signal, said second control signal, for controlling assertion of said third input signal in response to logical combinations of states of said first port signal, said first input signal and said second input signal.

3. The apparatus in accordance with claim 2 wherein said bi-directional buffer further comprises:

data storage means for receiving and storing control data conveyed thereto on a bus; and means for generating said first and second control signals in response to said control data stored by said data storage means.

4. The apparatus in accordance with claim 2 wherein said first logic means asserts said first input signal in delayed response to said logical combination of states of said second port signal, said third input signal, said fourth input signal and said first control signal, a duration of delay of said delayed response being determined by a delay signal supplied as input to said apparatus.

5. A bi-directional buffer responsive to a delay control signal supplied as input thereto for providing an interface between first and second port signals comprising:

first driver means receiving first and second input signals, for driving said first port signal to a first logic state in response to assertion of said first input signal and for driving said first port signal to a second logic state in response to assertion of said second input signal;

second driver means receiving third and fourth input signals for driving said second port signal to a third logic state in response to assertion of said third input signal and for driving said second port signal to a fourth logic state in response to assertion of said fourth input signal;

first single-shot means receiving said first input signal for asserting and the deasserting said second input signal in response to said first input signal;

second single-shot means receiving said third input signal for asserting and then deasserting said fourth input signal in response to said third input signal;

first logic means receiving said second port signal, said third input signal, said fourth input signal and said delay control signal, for controlling assertion of said first input signal in delayed response to logical combinations of states of said second port signal, said third input signal and said fourth input signal, a duration of delay of said response being determined by said delay control signal; and second logic means receiving said first port signal, said first input signal, and said second input signal, for controlling assertion of said third input signal in response to logical combinations of states of said first port signal, said first input signal and said second input signal.

6. The apparatus in accordance with claim 5 further comprising:

data storage means for receiving and storing control data conveyed thereto on a bus; and means for generating said delay control signal in response to said control data stored by said data storage means.

* * * * *

UNITED STATES PATENT AND TRADEMARK OFFICE
CERTIFICATE OF CORRECTION

PATENT NO.   : 5,282,271
DATED        : January 25, 1994
INVENTOR(S)  : Wen-Jai HSIEH et al It is certified that error appears in the above-indentified patent and that said Letters Patent is hereby corrected as shown below:

On the cover sheet, left column, the inventor's name "Jeng" should read --Jenq--.

Signed and Sealed this

Thirty-first Day of May, 1994

*Attest:*

BRUCE LEHMAN

*Attesting Officer*   *Commissioner of Patents and Trademarks*